United States Patent
Menge (10) Patent No.: US 9,018,588 B2
(45) Date of Patent: Apr. 28, 2015

(54) RADIATION DETECTION APPARATUSES INCLUDING OPTICAL COUPLING MATERIAL, AND PROCESSES OF FORMING THE SAME

(71) Applicant: Peter R. Menge, Novelty, OH (US)

(72) Inventor: Peter R. Menge, Novelty, OH (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 282 days.

(21) Appl. No.: 13/716,106

(22) Filed: Dec. 15, 2012

(65) Prior Publication Data

US 2013/0193332 A1 Aug. 1, 2013

Related U.S. Application Data

(60) Provisional application No. 61/582,190, filed on Dec. 30, 2011.

(51) Int. Cl.
| | | |
|---|---|---|
| *G01T 1/20* | (2006.01) | |
| *H01L 31/18* | (2006.01) | |
| *H01L 31/0232* | (2014.01) | |
| *H01L 31/115* | (2006.01) | |

(52) U.S. Cl.
CPC .............. *G01T 1/2002* (2013.01); *H01L 31/18* (2013.01); *G01T 1/2018* (2013.01); *H01L 31/02322* (2013.01); *H01L 31/115* (2013.01)

(58) Field of Classification Search
CPC .............. G01T 1/20; G01V 5/20; H01L 31/18
USPC ............. 250/366–388, 361 R, 370.11, 487.1; 438/65
See application file for complete search history.

(56) References Cited

U.S. PATENT DOCUMENTS

| | | | |
|---|---|---|---|
| 5,374,824 A | 12/1994 | Chaney et al. | |
| 5,430,298 A | 7/1995 | Possin et al. | |
| 6,396,046 B1 | 5/2002 | Possin et al. | |
| 6,519,313 B2 | 2/2003 | Venkataramani et al. | |
| 7,554,087 B2 * | 6/2009 | Kondo et al. | 250/361 R |
| 7,569,832 B2 | 8/2009 | Tredwell et al. | |
| 7,626,176 B2 | 12/2009 | Zeitler et al. | |
| 2008/0054181 A1 | 3/2008 | Kondo et al. | |
| 2008/0277588 A1 * | 11/2008 | Zeitler et al. | 250/370.11 |
| 2010/0072376 A1 * | 3/2010 | Ronda | 250/362 |
| 2010/0116995 A1 | 5/2010 | Levene et al. | |
| 2010/0207031 A1 | 8/2010 | Leppert | |

OTHER PUBLICATIONS

International Search Report for PCT/US2012/070029 dated Apr. 16, 2013, 4 pgs.

* cited by examiner

*Primary Examiner* — David Porta
*Assistant Examiner* — Meenakshi Sahu
(74) *Attorney, Agent, or Firm* — Abel Law Group, LLP; Robert N. Young (57) ABSTRACT

A radiation detection apparatus can have optical coupling material capable of absorbing wavelengths of light within approximately 75 nm of a wavelength of scintillating light of a scintillation member of the radiation detection apparatus. In an embodiment, the optical coupling material can be disposed between a photosensor of the radiation detection apparatus and the scintillation member. In a particular embodiment, the composition of the optical coupling material can include a dye. In an illustrative embodiment, the dye can have a corresponding a* coordinate, a corresponding b* coordinate, and an L* coordinate greater than 0. In another embodiment, the optical coupling material can be disposed along substantially all of a side of the photosensor.

25 Claims, 3 Drawing Sheets

RADIATION DETECTION APPARATUSES INCLUDING OPTICAL COUPLING MATERIAL, AND PROCESSES OF FORMING THE SAME

CROSS-REFERENCE TO RELATED APPLICATION

This application claims priority under 35 U.S.C. §119(e) to U.S. Patent Application No. 61/582,190 entitled "Radiation Detection Apparatuses Including Optical Coupling Material, and Processes of Forming the Same," by Menge, filed Dec. 30, 2011, which is assigned to the current assignee hereof and incorporated herein by reference in its entirety.

FIELD OF THE DISCLOSURE

The present disclosure is directed to radiation detection apparatuses including optical coupling material disposed between a scintillation member and a photosensor, and processes of forming the same.

BACKGROUND

Scintillation materials can be used for medical imaging and for well logging in the oil and gas industry as well as for environmental monitoring, security applications, and for nuclear physics analysis and applications. In particular, scintillation materials can emit photons when exposed to certain forms of radiation. The photons can pass to a sensor that converts sensed photons into electrical pulses that can then be transmitted to analyzing equipment. Further improvement of radiation detection apparatuses is desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or other features that are inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the embodiments of the disclosure. This description should be read to include one or at least one and the singular also includes the plural, or vice versa, unless it is clear that it is meant otherwise.

As used in this specification, color space is expressed in terms of L*, a*, and b* coordinates as specified by the Commission Internationale de l'éclairage ("CIE") 1976. The three coordinates represent the lightness of the color (L*=0 yields black and L*=100 indicates diffuse white; specular white may be higher), its position between red/magenta and green (a*, negative values indicate green while positive values indicate magenta) and its position between yellow and blue (b*, negative values indicate blue and positive values indicate yellow).

Unless otherwise defined, all technical and scientific terms used herein have the same meaning as commonly understood by one of ordinary skill in the art to which this disclosure belongs. The materials, methods, and examples are illustrative only and not intended to be limiting. To the extent not described herein, many details regarding specific materials and processing acts are conventional and may be found in textbooks and other sources within the scintillation and radiation detection arts.

Figure 1:
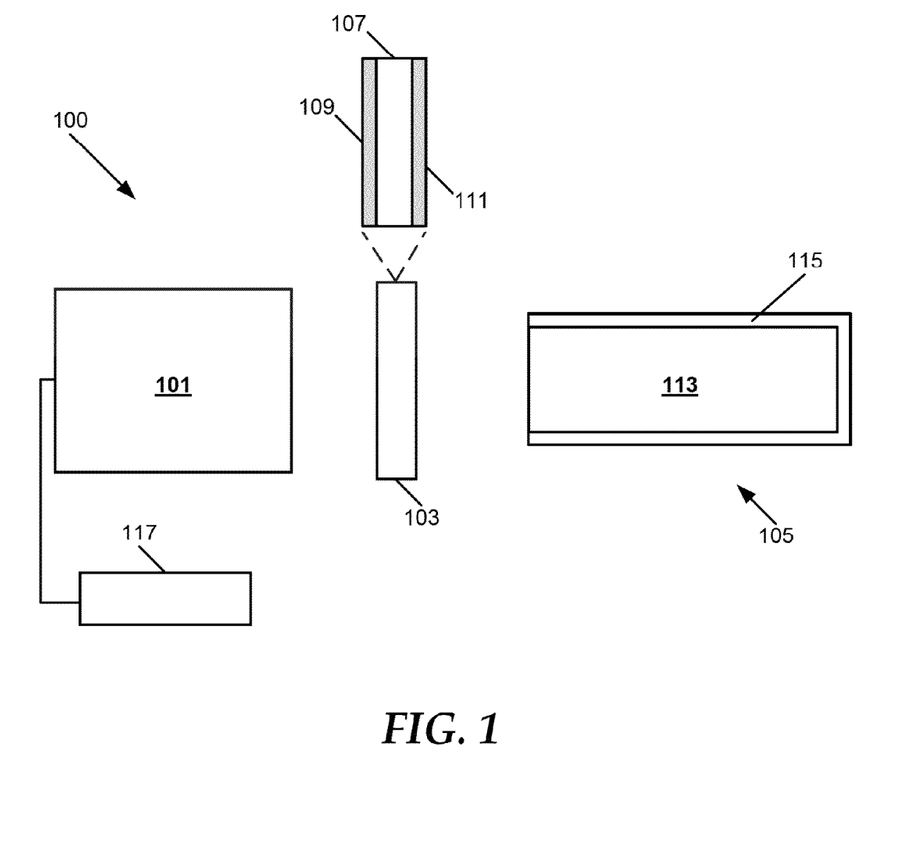
FIG. 1 includes an illustration of a radiation detection apparatus in accordance with a particular embodiment.

FIG. 1 includes an illustration of a radiation detection apparatus 100 in accordance with a particular embodiment. The radiation detection apparatus 100 can include a medical imaging apparatus, a well logging apparatus, or a security inspection apparatus. In an embodiment, the radiation detection apparatus 100 can include or be a component of a Computed Tomography ("CT") apparatus, a Single Positron Emission Computer Tomography ("SPECT") apparatus, or a Positron Emission Tomography ("PET") apparatus.

The radiation detection apparatus 100 can include a photosensor 101, an optical interface 103, and a scintillation device 105. The photosensor 101 can be a photodiode; a p-type-intrinsic type-n-type semiconductor region ("PIN") silicon diode; a photomultiplier tube ("PMT"); a silicon photomultiplier tube ("SiPM"); an avalanche photodiode ("APD"); or a hybrid PMT.

In an embodiment, the optical interface 103 can comprise an optical coupling material, such as an organic polymer, an inorganic compound, another suitable optical coupling material, or any combination thereof. For example, the optical interface 103 can include a silicone rubber, an epoxy, a plastic, or any combination thereof. In another embodiment, the optical interface 103 includes a window 107 disposed between the photosensor 101 and the scintillation device 105. The window 107 can be optically coupled to the photosensor 101 and the scintillation device 105 via a layer 109 of optical coupling material and a layer 111 of optical coupling material. In an embodiment, the window 107 includes quartz or sapphire. Although the photosensor 101, the optical interface 103, and the scintillation device 105 are illustrated separate from each other, the photosensor 101 and the scintillation device 105 can each be adapted to be coupled to the optical interface 103, with the optical interface 103 disposed between the photosensor 101 and the scintillation device 105. In other embodiments, the optical interface 103 may not include the window 107 and may include one or more layers of optical coupling material, such as the layer 109, the layer 111, or both. Additionally, the optical interface 103 can include the window 107 and not include the layer 109, the layer 111, or both the layer 109 and the layer 111. In an alternative embodiment, the radiation detection apparatus 100 can include the optical interface 103 and the scintillation device 105 without the photosensor 101.

In an embodiment, one or more portions of the optical interface 103 can have a particular color. The particular color of the optical interface 103 can correspond approximately to a particular wavelength of a spectrum of wavelengths of scintillating light emitted by the scintillation device 105. In the illustrative embodiment of FIG. 1, the layer 109 and the layer 111 have a respective color. In another embodiment, one or more layers of optical coupling material of the optical interface 103 can include a dye that causes a color of the layer 109, a color of the layer 111, or both, to correspond approximately to a particular wavelength of a spectrum of wavelengths of scintillating light emitted by the scintillation device 105. In a particular embodiment, the spectrum of wavelengths of the scintillating light can include a peak wavelength. A peak wavelength of the spectrum of wavelengths of the scintillating light as used herein refers to a wavelength corresponding to an emission maximum of the scintillating light. In a more particular embodiment, the spectrum of wavelengths of the scintillating light can include more than one mode and have a corresponding peak wavelength for each mode. In an illustrative embodiment, the range of wavelengths within the spectrum of wavelengths of the scintillating light may be no greater than approximately 150 nm, no greater than approximately 110 nm, no greater than approximately 80 nm, or no greater than approximately 40 nm. In another embodiment, the range of wavelengths within the spectrum of wavelengths of the scintillating light can be at least approximately 5 nm, at least approximately 20 nm, at least approximately 35 nm, or at least approximately 50 nm. In another embodiment, the spectrum of wavelengths of the scintillating light can include wavelengths within approximately 47% of an emission maximum of the spectrum, wavelengths within approximately 46% of the emission maximum of the spectrum, or wavelengths within approximately 45% of the emission maximum of the spectrum.

In an embodiment, the dye can have a corresponding a* coordinate and a corresponding b* coordinate. In addition, the corresponding L* coordinate of the dye can be greater than 0. The dye can modify a corresponding a* coordinate of optical coupling material of the optical interface 103, a corresponding b* coordinate of the optical coupling material of the optical interface 103, a corresponding L* coordinate of the optical coupling material of the optical interface 103, or any combination thereof. In an embodiment, the optical coupling material of the optical interface 103 can be capable of absorbing a particular wavelength of radiation within approximately 75 nm of any wavelength within the spectrum of wavelengths of scintillating light emitted by the scintillation device 105, within approximately 65 nm of any wavelength within the spectrum of wavelengths of the scintillating light emitted by the scintillation device 105, or within approximately 45 nm of any wavelength within the spectrum of wavelengths of the scintillating light emitted by the scintillation device 105.

In an embodiment, the window 107 can have a color. The color of the window can be provided by an additive of the window 107, such as an iron oxide, a manganese oxide, a cobalt oxide, another suitable metal oxide, a metal sulfide, a metal carbide, or any combination thereof. In another embodiment, the color of the window 107 can be naturally occurring due to the presence of certain components of the window 107. In an additional embodiment, the window 107 is capable of absorbing a particular wavelength of radiation within approximately 75 nm of any wavelength within the spectrum of wavelengths of scintillating light emitted by the scintillation device 105, within approximately 65 nm of any wavelength within the spectrum of wavelengths of the scintillating light emitted by the scintillation device 105, or within approximately 45 nm of any wavelength within the spectrum of wavelengths of the scintillating light emitted by the scintillation device 105.

The scintillation device 105 includes a scintillation unit 113. In an embodiment, the scintillation unit 113 can include one or more scintillation members. In a particular embodiment, the scintillation unit 113 includes an array of scintillation members. In some embodiments herein, an array of scintillation members can also be referred to as an array of scintillation pixels. Each of the scintillation members can include a metal halide, a metal oxide, a metal silicate, another suitable scintillator material, or any combination thereof. In a particular embodiment, the metal halide can include NaI(Tl), CsI(Tl or Na), $LaBr_3(Ce)$, $CeBr_3$, $SrI_2(Eu)$, or an elpasolite (for example, $Cs_2LiYCl_6(Ce)$), the metal oxide can include $LuAlO_3(Ce)$ or $Lu_3Al_5O_{12}(Ce)$, and the metal silicate can include $Gd_2SiO_5(Ce)$, $LuSiO_5(Ce)$, or $Lu_2Si_2O_7(Ce)$. For some of the compounds, Lu or Gd may be partly replaced by Y. The scintillator materials are listed to merely illustrate and not limit the present invention. In a particular embodiment, each scintillation member of the scintillation unit 113 can be aligned with a respective photosensor. For example, a particular scintillation member can correspond with a particular photosensor 101. In another embodiment, multiple scintillation members of the scintillation unit can correspond with a particular photosensor. In an illustrative embodiment, a ratio of a number of scintillation members of the scintillation device 105 to a number of photosensors of the radiation detection apparatus 100 can be at least approximately 1:1, at least approximately 2:1, or at least approximately 4:1.

In the illustrative embodiment of FIG. 1, the scintillation device 105 includes a reflector 115 substantially surrounding the scintillation unit 113. The reflector 115 can include a metal foil, polytetrafluoroethylene (PTFE), or another suitable material capable of reflecting light emitted by the scintillation member 113. In an embodiment, the radiation detection apparatus 100 can include more components or fewer components than those shown in FIG. 1. For example, radiation detection apparatus 100 may include one or more stabilization mechanisms, such as one or more springs. In another example, the scintillation unit 113 may be partially surrounded by the reflector 115.

The photosensor 101 can receive photons of scintillating light emitted by one or more scintillation members of the scintillation unit 113 when the respective scintillation member is exposed to one or more forms of radiation. The one or more scintillation members of the scintillation unit 113 can emit a spectrum of wavelengths of the scintillating light in a range of approximately 250 nm to approximately 600 nm. When the photosensor 101 receives photons from the scintillation device 105, the photosensor 101 can produce electrical pulses based on numbers of photons received from the scintillation device 105. The photosensor 101 may provide the electrical pulses to electronics 117 that are electrically coupled to the photosensor 101. The electrical pulses can be shaped, digitized, analyzed, or any combination thereof, by the electronics 117 to provide a count of the photons received at the photosensor 101 or other information. The electronics 117 can include an amplifier, a pre-amplifier, a discriminator, an analog-to-digital signal converter, a photon counter, another electronic component, or any combination thereof. The photosensor 101 can be housed within a tube or housing made of a material capable of protecting the photosensor 101, the electronics 117, or a combination thereof, such as a metal, a metal alloy, other material, or any combination thereof.

In an illustrative embodiment, photons can exit a side of the scintillation unit 113 that is adjacent to the optical interface 103. A number of photons exiting the scintillation unit 113 and reaching the photosensor 101 are sensed by the photosensor 101. Other photons exiting the scintillation unit 113 can be sensed by one or more other photosensors (not illustrated). As used in the Specification herein, the term "cross-talk" refers to photons emitted by a particular scintillation member that are sensed by a photosensor that does not correspond to the particular scintillation member. For example, a particular scintillation member of the scintillation unit 113 can correspond with the photosensor 101, and "cross-talk" can refer to photons emitted by the particular scintillation member that are not sensed by the photosensor 101, but that are sensed by another photosensor (not illustrated). In an embodiment, the optical interface 103 can have a color to absorb photons emitted from the particular scintillation member of the scintillation unit 113 to reduce the cross-talk. In a particular embodiment, at least a portion of the optical interface 103 can have a color that substantially corresponds to a wavelength of scintillating light emitted by the scintillation member 113. In this way, photons exiting the particular scintillation member that are not sensed by the corresponding photosensor 101 are more likely to be absorbed by the optical interface 103 before being sensed by another photosensor. Thus, cross-talk can be reduced, and blur can also be reduced in images produced via the radiation detection apparatus 100.

Figure 2:
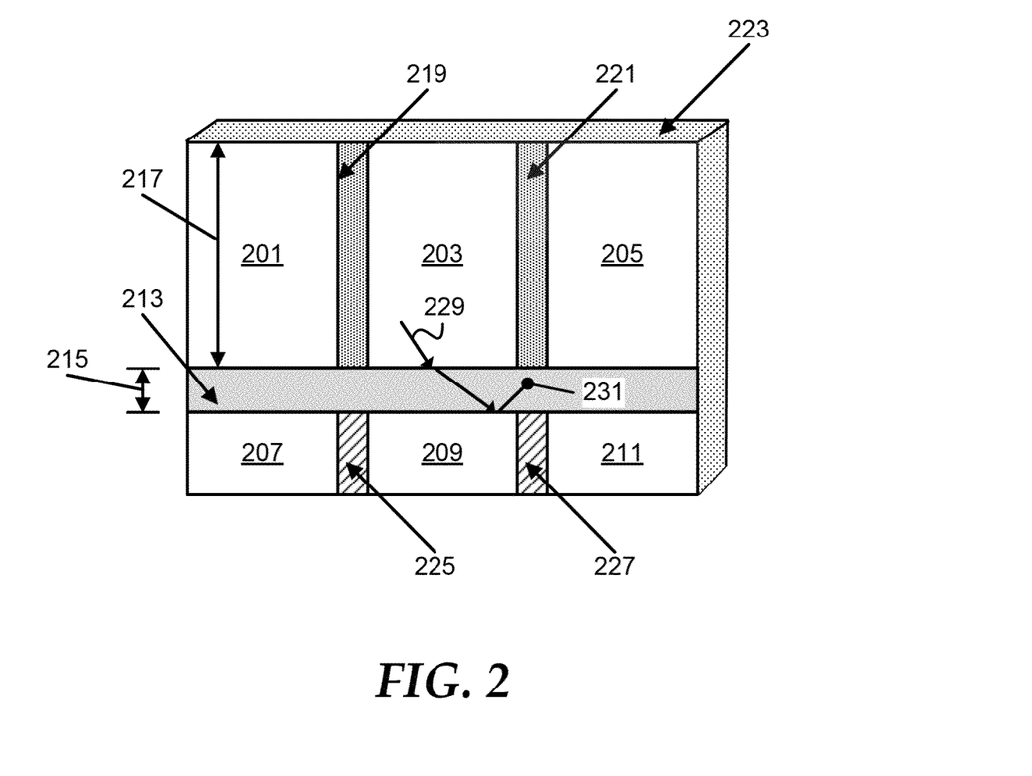
FIG. 2 includes an illustration of an array of scintillation members and an array of photosensors in accordance with a particular embodiment.

FIG. 2 includes an illustration of an array of scintillation members and an array of photosensors in accordance with a particular embodiment. The array of scintillation members can include scintillation members 201, 203, and 205, and the array of photosensors can include photosensors 207, 209, and 211. Although the illustrative embodiment of FIG. 2 includes an array having three scintillation members and an array having three photosensors, an array of scintillation members and an array of photosensors can include any suitable number of scintillation members and photosensors that may extend in one direction or more than one direction. In addition, in a particular embodiment, one or more of the scintillation members 201, 203, or 205 can be a component of the scintillation unit 113 of FIG. 1.

In the illustrative embodiment of FIG. 2, each of the scintillation members 207, 209, and 211 is aligned with a corresponding photosensor. For example, the scintillation member 201 corresponds with the photosensor 207, the scintillation member 203 corresponds with the photosensor 209, and the scintillation member 205 corresponds with the photosensor 211. Accordingly, photons exiting the scintillation member 201 are to be sensed by the photosensor 207, photons exiting the scintillation member 203 are to be sensed by the photosensor 209, and photons exiting the scintillation member 205 are to be sensed by the photosensor 211. In a particular embodiment, the scintillation members 201, 203, and 205 lie along a substantially common plane. In the illustrative embodiment of FIG. 2, the substantially common plane is horizontal. In other embodiments, the substantially common plane can be vertical.

The scintillation members 201, 203, and 205 can be optically coupled to the photosensors 207, 209, and 211 by an optical coupling material 213 disposed between the scintillation members 201, 203, and 205 and the photosensors 207, 209, and 211. The optical coupling material 213 can be disposed substantially along all of a side of the photosensors 207, 209, and 211. The optical coupling material 213 can also be disposed substantially along all of a side of the scintillation members 201, 203, and 205. In an embodiment, the optical coupling material 213 contacts a surface of the scintillation members 201, 203, and 205. In an additional embodiment, substantially no voids are disposed between the scintillation members 201, 203, and 205 and the photosensors 207, 209, and 211.

In the illustrative embodiment of FIG. 2, the optical coupling material 213 has a thickness 215. In an embodiment, the thickness 215 is substantially uniform. In another embodiment, the thickness of the optical coupling material 213 is within a range of approximately 45 micrometers to approximately 2 millimeters. As used herein, pitch refers to a sum of the widths of a scintillation member and an immediately adjacent space. In an embodiment, a pitch corresponding to one or more of the scintillation members 201, 203, and 205 may be no greater than approximately 9 mm, no greater than approximately 4 mm, no greater than approximately 1.4 mm, no greater than approximately 1.1 mm, or no greater than approximately 0.7 mm. In another embodiment, the pitch of one or more of the scintillation members 201, 203, and 205 can be at least approximately 0.3 mm, at least approximately 0.6, mm, or at least approximately 0.9 mm. In an embodiment, a length 217 of one or more of the scintillation members 201, 203, and 205 can be at least approximately 0.8 mm, at least approximately 2 mm, or at least approximately 5 mm, and in another embodiment, the length 217 may be no greater than approximately 90 mm, no greater than approximately 50 mm, or no greater than approximately 30 mm. In a particular embodiment, the length 217 is within a range of more approximately 0.8 mm to approximately 50 mm.

In an embodiment, one or more of the scintillation members 201, 203, and 205 can be adjacent to septa, such as septum 219 and septum 221. In a particular embodiment, the septum 219 and the septum 221 can include a reflective material, such as a metal foil, PTFE, $TiO_2$, another suitable reflective material, or any combination thereof. In a further embodiment, one or more sides of the scintillation members 201, 203, and 205; one or more sides of the optical coupling material 213; one or more sides of the photosensors 207, 209, and 211; or any combination thereof, can be surrounded by reflective material 223. In an additional embodiment, one or more of the photosensors 207, 209, and 211 can be adjacent to septa, such as septum 225 and septum 227. In an embodiment, the septa 219 and 221 can include material that is different from the septa 225 and 227.

In an embodiment, a surface of one or more of the scintillation members 201, 203, and 205 can be substantially smooth. In a particular embodiment, the side of one or more of the scintillation members 201, 203, and 205 adjacent to the optical coupling material 213 can be substantially smooth. In an illustrative embodiment, a surface of one or more of the scintillation members 201, 203, and 205 adjacent to the optical coupling material 213 may have an $R_a$ value of no greater than approximately 0.50 micrometers, no greater than approximately 0.025 micrometers, or no greater than approximately 0.0060 micrometers. In a further embodiment, the surface of one or more of the scintillation members 201, 203, and 205 that is adjacent to the optical coupling material 213 lies substantially along a cleavage plane of the respective scintillation members 201, 203, and 205. In another embodiment, the surface of one or more of the scintillation members 201, 203, and 205 that is adjacent to the optical coupling material 213 can be rough. For example, a surface of one or more of the scintillation members 201, 203, and 205 that is adjacent to the optical coupling material 213 can have an $R_a$ value of at least approximately 1.75 micrometers, at least approximately 1.10 micrometers, or at least approximately 0.65 micrometers.

In an embodiment, the optical coupling material 213 can have a substantially uniform composition. In a particular embodiment, the optical coupling material 213 includes a dye. In a more particular embodiment, the dye can be an organic compound, such as an aromatic organic compound, or an inorganic compound. The dye can be capable of modifying the color of the optical coupling material 213 such that the optical coupling material 213 is capable of absorbing a particular wavelength of radiation within approximately 75 nm of any wavelength within a spectrum of scintillating light emitted by the scintillation members 201, 203, and 205. In a particular embodiment, the dye can have a color that corresponds approximately to the particular wavelength of any one of the wavelengths of the spectrum of the scintillating light emitted by the scintillating members 201, 203, and 205. The dye can have a corresponding a* coordinate, a corresponding b* coordinate, a corresponding L* coordinate, or any combination thereof. Further, the optical coupling material 213 can have a corresponding a* coordinate, a corresponding b* coordinate, a corresponding L* coordinate, or any combination thereof. In an illustrative embodiment, a corresponding a* coordinate of the optical coupling material 213 may be no greater than approximately 18, no greater than approximately 5, or no greater than approximately −15. In another embodiment, the corresponding a* coordinate of the optical coupling material 213 can be at least approximately −70, at least approximately −40, or at least approximately −5. In a further embodiment, a corresponding b* coordinate of the optical coupling material 213 may be no greater than approximately 45, no greater than approximately 20, or no greater than approximately 5. In an additional embodiment, the corresponding b* coordinate of the optical coupling material 213 can be at least approximately −25, at least approximately −10, or at least approximately 15.

Additionally, in an embodiment, the scintillating light of the scintillation members 201, 203, and 205 can have a corresponding a* coordinate of $a_1$* and a corresponding b* coordinate of $b_1$*. Further, the optical coupling material 213 can have a corresponding a* coordinate of $a_2$* and a corresponding b* coordinate of $b_2$*. The difference between the corresponding a* coordinates of the scintillating light and the optical coupling material 213 may be such that $|a_1^* - a_2^*|$ is no greater than approximately 18, no greater than approximately 12, or no greater than approximately 7. Also, the difference between the corresponding b* coordinates of the scintillating light and the optical coupling material 213 may be such that $|b_1^* - b_2^*|$ is no greater than approximately 12, no greater than approximately 8, or no greater than approximately 4. In another embodiment, the difference between the corresponding a* coordinates and the corresponding b* coordinates of the scintillating light and the optical coupling material 213 may be such that both $|a_1^* - a_2^*|$ and $|b_1^* - b_2^*|$ are no greater than approximately 16, no greater than approximately 6, or no greater than approximately 3.

In an illustrative embodiment, photons can exit the scintillation members 201, 203, and 205 via a side that is adjacent to the optical coupling material 213. At least a portion of the photons exiting a particular one of the scintillating members 201, 203, or 205 can be sensed by a corresponding photosensor 207, 209, or 211. In an embodiment, some photons exiting one or more scintillation member 201, 203, and 205 may not be sensed by a corresponding photosensor. For example, in FIG. 2, the photon 229 exits the scintillation member 203, enters the optical interface 213, and is not sensed by the corresponding photosensor 209. Instead, the photon 229 travels laterally through the optical coupling material 213. Continuing with this example, the photon 229 is absorbed in the optical coupling material 213 at a point 231. The color of the optical coupling material 213 can enhance the absorption of photons in the optical coupling material 213 when the photons are not sensed by a photosensor 207, 209, or 211 associated with a corresponding scintillation member 201, 203, or 205 that produced the photons. In a particular embodiment, when the color of the optical coupling material 213 corresponds to one or more wavelengths of the spectrum of scintillating light emitted by the scintillation members 201, 203, and 205, photons that are not sensed by the corresponding photosensors 207, 209, and 211 can be more likely to be absorbed by the optical coupling material 213 than when the optical coupling material 213 does not have a color corresponding to one or more wavelengths of the spectrum of the scintillating light. In an embodiment, a percentage of photons exiting one of the scintillation members 201, 203, 205 that exit into the optical coupling material 213 and that are sensed by photosensors that do not correspond to that scintillation member may be no greater than approximately 32%, no greater than approximately 26%, or no greater than approximately 18%. When conventional optical coupling material not having a dye is disposed between scintillation members and photosensors, the percentage of photons sensed by other photosensors can be greater than 36%.

In another embodiment, a percentage of photons exiting a particular scintillation member 201, 203, or 205 that is sensed within 4 times the thickness 215 of the optical coupling material 213 may be no greater than approximately 98%, no greater than approximately 94%, or no greater than approximately 91%. Additionally, a percentage of photons exiting a particular scintillation member that is sensed within a peripheral region of approximately 4 times the thickness 215 can be at least approximately 85%, at least approximately 87%, or at least approximately 92%. When convention optical coupling material is disposed between scintillation devices and corresponding photosensors, the percentage of photons exiting a particular scintillation device that is sensed within a peripheral region of approximately 4 times the thickness 215 is less than 87%. In an embodiment, the peripheral region can include a radius.

In an embodiment, a mean free path of photons traveling in the optical coupling material 213 can be reduced in comparison to photons traveling in an optical coupling material that does not include a dye or is otherwise clear (i.e., has no color). A reduction in the mean free path of the photons traveling in the optical coupling material 213 can indicate less cross-talk. In a particular embodiment, a mean free path of the photons exiting one of the scintillation members 201, 203, or 205 and entering the optical coupling material 213 can be at least approximately 2 times the thickness 215 of the optical coupling material 213, at least approximately 5 times the thickness 215 of the optical coupling material 213, or at least approximately 8 times the thickness 215 of the optical coupling material 213. In another embodiment, a mean free path of photons exiting a particular scintillation member 201, 203, or 205 and entering the optical coupling material 213 may be no greater than approximately 15 times the thickness 215 of the optical coupling material 213, no greater than approximately 11 times the thickness 215 of the optical coupling materials 213, or no greater than approximately 9 times the thickness 215 of the optical coupling material 213. In a further embodiment, a mean free path of photons traveling in the optical coupling material 213 may be used to determine a distance between one or more of the scintillation members 201, 203, and 205; a distance between one or more of the photosensors 207, 209, and 211; a ratio of photosensors to scintillation members; a width of one or more of the septa 219, 221, 225, or 227; or any combination thereof.

Although, the illustrative embodiment of FIG. 2 shows that each of the scintillation devices 201, 203, and 205 is aligned with a respective photosensor 207, 209, or 211, in another embodiment, one or more of the photosensors 207, 209, and 211 can be replaced with fewer photosensors. In a particular embodiment, photons exiting multiple scintillation devices 201, 203, and 205 can be sensed by a single photosensor.

Figure 3:
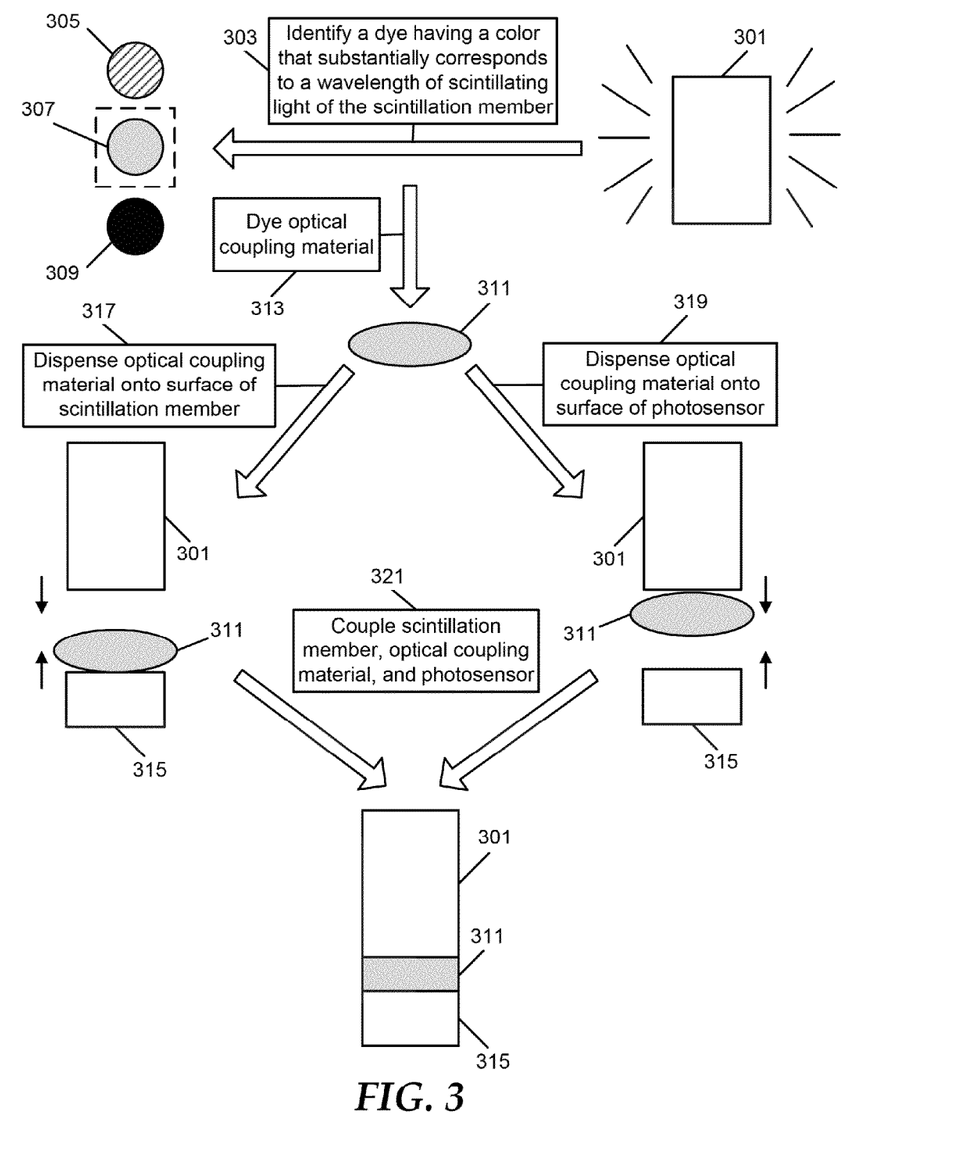
FIG. 3 includes an illustration of a process to fabricate a radiation detection apparatus having dyed optical coupling material in accordance with particular embodiments.

FIG. 3 includes an illustration of a process to fabricate a radiation detection apparatus having dyed optical coupling material in accordance with particular embodiments. In the illustrative embodiment of FIG. 3, a scintillation member 301 emits scintillating light. In an embodiment, the scintillation member 301 can be a scintillation member of the scintillation device 105 of FIG. 1, one of the scintillation members 201, 203, or 205 of FIG. 2, or another scintillation member.

A particular dye can be identified at 303 that has a color corresponding to a wavelength of the spectrum of wavelengths of the scintillating light emitted by the scintillation member 301. In one embodiment, a particular dye is selected from among a number of dyes 305, 307, and 309. In the illustrative embodiment of FIG. 3, the dye 307 is selected because the dye 307 has a color that approximately corresponds to at least one wavelength of the spectrum of scintillating light of the scintillation member 301. In a further embodiment, the dye 307 can have a corresponding a* coordinate and a corresponding b* coordinate. The dye 307 can also have a corresponding L* coordinate that is greater than 0. In other embodiments, one or more dyes can be combined to have the color that corresponds to at least one wavelength of the spectrum of wavelengths of the scintillating light of the scintillation member 301. In another embodiment including a different scintillating member emitting scintillating light having a different spectrum of wavelengths, a different dye having a different color can be selected, where the different color can approximately correspond to at least one wavelength of the spectrum of wavelengths of scintillating light of the different scintillation member.

Optical coupling material 311 can be dyed at 313. For example, the optical coupling material 311 can be dyed with the dye 307. Dyeing the optical coupling material 311 with the dye 307 can modify a corresponding a* coordinate of the optical coupling material 311, a corresponding b* coordinate of the optical coupling material 311, a corresponding L* coordinate of the optical coupling material 311, or any combination thereof. In an embodiment, a concentration of the dye 307 in the optical coupling material 311 can be at least approximately 8 mg/L, at least approximately 35 mg/L, or at least approximately 70 mg/L. In another embodiment, a concentration of the dye 307 in the optical coupling material 311 may be no greater than approximately 190 mg/L, no greater than approximately 155 mg/L, or no greater than approximately 90 mg/L.

In an embodiment, after being dyed, the optical coupling material 311 can be capable of absorbing at least one wavelength within approximately 75 nm of any wavelength within the spectrum of wavelengths of scintillating light emitted by the scintillation member 301. The optical coupling material 311 can then be dispensed onto a surface of a photosensor 315 at 317 or onto a surface of the scintillation member 301 at 319. At 321, surfaces of the scintillation member 301, the optical coupling material 311, and the photosensor 315 are coupled to each other. In this way, the scintillation member 301 can be optically coupled to the photosensor 315 by optical coupling material 311 disposed between the scintillation member 301 and the photosensor 315. In a particular embodiment, the photosensor 315 can sense a particular range of wavelengths of light and the scintillation member 301 can be selected such that the particular range of wavelengths of light sensed by the photosensor 315 includes at least a portion of the wavelengths of the spectrum of wavelengths of the scintillating light emitted by the scintillation member 301.

Although the illustrative embodiment of FIG. 3 illustrates the dyeing of the optical coupling material 311 before dispensing the optical coupling material 311 onto a surface of the photosensor 315 or onto a surface of the scintillation member 301, in another embodiment, the optical coupling material 311 can be dyed after disposing the optical coupling material 311 onto the surface of the scintillation member 301 or onto the surface of the photosensor 315. In a further embodiment, the optical coupling material 311 can be dyed after coupling the scintillation member 301, the optical coupling material 311, and the photosensor 315 to each other.

Embodiments may be in accordance with any one or more of the items as listed below.

Item 1. A radiation detection apparatus can include a first scintillation member and a second scintillation member, the first scintillation member and the second scintillation member emitting scintillating light having a spectrum of wavelengths; and an optical coupling material disposed adjacent to substantially all of a side of the first scintillation member and the second scintillation member, and the optical coupling material being capable of absorbing a particular wavelength of radiation within approximately 75 nm of any wavelength within the spectrum of wavelengths.

Item 2. The radiation detection apparatus as recited in Item 1, wherein a composition of the optical coupling material includes a dye.

Item 3. The radiation detection apparatus as recited in Item 2 wherein the dye has a color corresponding to a wavelength within the spectrum of wavelengths.

Item 4. A radiation detection apparatus can include a first scintillation member, a second scintillation member, and an optical coupling material disposed adjacent to substantially all of a side of the first scintillation member and the second scintillation member, and the optical coupling material having a corresponding non-zero a* coordinate and a corresponding non-zero b* coordinate.

Item 5. The radiation detection apparatus as recited in Item 4, wherein the optical coupling material has a dye including a corresponding a* coordinate and a corresponding b* coordinate.

Item 6. The radiation detection apparatus as recited in Item 5, wherein the dye has a corresponding L* coordinate that is greater than 0.

Item 7. The radiation detection apparatus as recited in Item 4 or 5, wherein the corresponding a* coordinate of the optical coupling material is no greater than approximately 18, no greater than approximately 5, or no greater than approximately −15.

Item 8. The radiation detection apparatus as recited in Item 4, 5 or 7, wherein the corresponding a* coordinate of the optical coupling material is at least approximately −70, at least approximately −40, or at least approximately −5.

Item 9. The radiation detection apparatus as recited in any one of Items 4, 5, 7, and 8, wherein the corresponding b* coordinate of the optical coupling material is no greater than approximately 45, no greater than approximately 20, or no greater than approximately 5.

Item 10. The radiation detection apparatus as recited in any one of Items 4, 5, and 7 to 9, wherein the corresponding b* coordinate of the optical coupling material is at least approximately −25, at least approximately −10, or at least approximately 15.

Item 11. The radiation detection apparatus as recited in any one of Items 1 to 10, further comprising a photosensor optically coupled to the first scintillation member, and wherein the optical coupling material is disposed between the photosensor and the first scintillation member.

Item 12. The radiation detection apparatus as recited in Item 11, wherein the photosensor comprises a photodiode, a PIN silicon diode, a photomultiplier tube, a silicon photomultiplier, an avalanche photodiode, a hybrid photomultiplier tube, or any combination thereof.

Item 13. The radiation detection apparatus as recited in Item 11 or 12, wherein the second scintillation member is optically coupled to the photosensor.

Item 14. The radiation detection apparatus as recited in Item 13, wherein the optical coupling material is disposed between the second scintillation member and the photosensor.

Item 15. The radiation detection apparatus as recited in any one of Items 11 to 14, wherein a ratio of a number of scintillation members to a number of photosensors is at least approximately 1:1, at least approximately 2:1, or at least approximately 4:1.

Item 16. The radiation detection apparatus as recited in any one of Items 11 to 15, wherein a percentage of photons exiting the first scintillation member into the optical coupling material that is sensed by at least one other photosensor is no greater than approximately 32%, no greater than approximately 26%, or no greater than approximately 18%.

Item 17. The radiation detection apparatus as recited in Item 16, wherein a mean free path of the photons exiting the first scintillation member and entering the optical coupling material is at least approximately 1 times the thickness of the optical coupling material, at least approximately 4 times the thickness of the optical coupling material, or at least approximately 8 times the thickness of the optical coupling material.

Item 18. The radiation detection apparatus as recited in Item 16 or 17, wherein a mean free path of the photons exiting the first scintillation member and entering the optical coupling material is no greater than approximately 15 times the thickness of the optical coupling material, no greater than approximately 11 times the thickness of the optical coupling material, or no greater than approximately 9 times the thickness of the optical coupling material.

Item 19. The radiation detection apparatus as recited in any one Items 16 to 18, wherein a percentage of the photons exiting the first scintillation member that are sensed within the first scintillation member and a peripheral region of approximately 4 times the thickness of the optical coupling material is at least approximately 85%, at least approximately 87%, or at least approximately 92%.

Item 20. The radiation detection apparatus as recited in any one of Items 16 to 19, wherein a percentage of the photons exiting the first scintillation member that are sensed within the first scintillation member a peripheral region of approximately 4 times the thickness of the optical coupling material is no greater than approximately 98%, no greater than approximately 94%, or no greater than approximately 91%.

Item 21. The radiation detection apparatus as recited in any one of Items 11 to 20, wherein the optical coupling material directly contacts a surface of the first scintillation member and directly contacts a surface of the photosensor.

Item 22. The radiation detection apparatus as recited in any one of Items 11 to 21, wherein substantially no voids are disposed between the first scintillation member and the photosensor.

Item 23. The radiation detection apparatus as recited in any one of Items 1 to 3, wherein the optical coupling material includes a window.

Item 24. The radiation detection apparatus as recited in Item 23, wherein the window is capable of absorbing the particular wavelength of radiation within approximately 75 nm of any wavelength within the spectrum of wavelengths.

Item 25. The radiation detection apparatus as recited in any one of Items 11 to 22, further comprising a window disposed between the first scintillation member and the photosensor.

Item 26. The radiation detection apparatus as recited in Item 25, wherein a first layer of the optical coupling material is disposed between the window and the first scintillation member and a second layer of the optical coupling material is disposed between the window and the photosensor.

Item 27. The radiation detection apparatus as recited in any one of Items 23 to 26, wherein the window comprises quartz or sapphire.

Item 28. The radiation detection apparatus as recited in any one of Items 23 to 27, wherein the window comprises a metal oxide, a metal sulfide, a metal carbide, or any combination thereof.

Item 29. The radiation detection apparatus as recited in any one of the preceding Items, wherein the first scintillation member and the second scintillation member lie along a substantially common plane.

Item 30. The radiation detection apparatus as recited in any one of the preceding Items, a pitch corresponding to the first scintillation member, the second scintillation member, or both is within a range of approximately 0.3 mm to approximately 9 mm and a length within a range of approximately 0.8 mm to approximately 50 mm.

Item 31. The radiation detection apparatus as recited in any one of the preceding Items, wherein photons exit the first scintillation member via a particular side of the first scintillation member adjacent to the optical coupling material, and the radiation detection apparatus further comprises a reflector adjacent to one or more additional sides of the first scintillation member.

Item 32. The radiation detection apparatus as recited in any one of the preceding Items, wherein a particular surface of the first scintillation member is substantially smooth, the particular surface of the first scintillation member being adjacent to the optical coupling material.

Item 33. The radiation detection apparatus as recited in Item 32, wherein the particular surface has an $R_a$ value of no greater than approximately 0.50 micrometers, no greater than approximately 0.025 micrometers, or no greater than approximately 0.0060 micrometers.

Item 34. The radiation detection apparatus as recited in Item 32 or 33, wherein the particular surface lies substantially along a cleavage plane of the first scintillation member.

Item 35. The radiation detection apparatus as recited in any one of Items 1 to 31, wherein a particular surface of the first scintillation member is rough, the particular surface being adjacent to the optical coupling material.

Item 36. The radiation detection apparatus as recited in Item 35, wherein the particular surface has an $R_a$ value of at least approximately 1.75 micrometers, at least approximately 1.10 micrometers, or at least approximately 0.65 micrometers.

Item 37. The radiation detection apparatus as recited in any one of Items 11 to 15 and 21, further comprising a different photosensor optically coupled to the second scintillation member.

Item 38. The radiation detection apparatus as recited in Item 37, wherein the optical coupling material is disposed between the second scintillation member and the different photosensor.

Item 39. The radiation detection apparatus as recited in any one of the preceding Items, wherein the radiation detection apparatus comprises a medical imaging apparatus, a well logging apparatus, or a security inspection apparatus.

Item 40. The radiation detection apparatus as recited in any one of the preceding Items, wherein the optical coupling material comprises an organic polymer.

Item 41. The radiation detection apparatus as recited in Item 40, wherein the organic polymer includes a silicone rubber, an epoxy, a plastic, or any combination thereof.

Item 42. A radiation detection apparatus can include a scintillation member emitting scintillating light having a spectrum of wavelengths; a photosensor optically coupled to the scintillation member; and an optical coupling material disposed between the scintillation member and the photosensor, the optical coupling material being capable of absorbing a particular wavelength of radiation within approximately 75 nm of any wavelength within the spectrum of wavelengths.

Item 43. The radiation detection apparatus as recited in any one of the preceding Items, wherein the optical coupling material has a substantially uniform thickness.

Item 44. The radiation detection apparatus as recited in Item 43, wherein the thickness of the optical coupling material is within a range of approximately 45 micrometers to approximately 2 millimeters.

Item 45. The radiation detection apparatus as recited in any one of the preceding Items, wherein the optical coupling material has a substantially uniform composition.

Item 46. A process can include dispensing an optical coupling material onto a surface of a scintillation member, the optical coupling material being capable of absorbing a particular wavelength of radiation within approximately 75 nm of any wavelength within a spectrum of wavelengths of scintillating light of the scintillation member; and coupling the surface of the scintillation member and a surface of a photosensor to each other.

Item 47. A process can include dispensing an optical coupling material onto a surface of a scintillation member, the optical coupling material including a dye having a corresponding non-zero a* coordinate and a corresponding non-zero b* coordinate; and coupling the surface of the scintillation member and a surface of a photosensor to each other.

Item 48. The process as recited in Item 46 or 47, wherein the surface of the scintillation member is coupled with the photosensor after dispensing the optical coupling material onto the surface of the scintillation member.

Item 49. A process can include dispensing an optical coupling material onto a surface of a photosensor; and coupling the surface of the photosensor and a surface of a scintillation member to each other, the optical coupling material being capable of absorbing a particular wavelength of radiation within approximately 75 nm of any wavelength within a spectrum of wavelengths of scintillating light of the scintillation member.

Item 50. A process can include dispensing an optical coupling material onto a surface of a photosensor; and coupling the surface of the photosensor and a surface of the scintillation member to each other, the optical coupling material including a dye having a corresponding non-zero a* coordinate and a corresponding non-zero b* coordinate.

Item 51. The radiation detection apparatus or the process of any one of the preceding Items, wherein:
scintillating light of a particular scintillation member has a corresponding a* coordinate of $a_1^*$ and a corresponding b* coordinate of $b_1^*$;
the optical coupling material has a corresponding a* coordinate of $a_2^*$ and a corresponding b* coordinate of $b_2^*$;

$$D_1 = |a_1^* - a_2^*|;$$

$$D_2 = |b_1^* - b_2^*|;\text{ and}$$

any of:
$D_1$ has a value no greater than approximately 18, no greater than approximately 12, or no greater than approximately 7;
$D_2$ has a value no greater than approximately 12, no greater than approximately 8, or no greater than approximately 4; or
each of $D_1$ and $D_2$ have a value no greater than approximately 16, no greater than approximately 6, or no greater than approximately 3.

Item 52. A process can include identifying a dye having a color that approximately corresponds to a particular wavelength within a spectrum of wavelengths of scintillating light of a particular scintillation member; dyeing an optical coupling material with the dye; and disposing the optical coupling material along a side of the particular scintillation member.

Item 53. The process as recited in Item 52, further comprising selecting a different dye having a different color that approximately corresponds to a wavelength within a different spectrum of scintillating light of an additional scintillation member; and dyeing additional optical coupling material with the different dye.

Item 54. The process as recited in Item 52 or 53, wherein dyeing the optical coupling material modifies a corresponding a* coordinate of the optical coupling material, a corresponding b* coordinate of the optical coupling material, or both.

Item 55. The process as recited in any one of Items 52 to 54, further comprising, disposing a layer of the optical coupling material between the particular scintillation member and a photosensor after dyeing the optical coupling material.

Item 56. The process as recited in Item 55, wherein the photosensor senses a particular range of wavelengths of light, and the process further comprises selecting the particular scintillation member such that the particular range of wavelengths of light sensed by the photosensor includes the particular wavelength within the spectrum.

Item 57. The process as recited in any one of Items 47, 48, 50, and 52 to 56, wherein a concentration of the dye in the optical coupling material is at least approximately 8 mg/L, at least approximately 35 mg/L, or at least approximately 70 mg/L.

Item 58. The process as recited in any one of Items 47, 48, 50, and 52 to 57, wherein the concentration of dye in the optical coupling material is no greater than approximately 190 mg/L, no greater than approximately 155 mg/L, or no greater than approximately 90 mg/L.

Item 59. The process as recited in any one of Items 47, 48, 50, and 52 to 58, wherein the dye includes an organic compound or an inorganic compound.

Item 60. The radiation detection apparatus or the process as recited in Item 59, wherein the dye includes an aromatic organic compound.

Item 61. The radiation detection apparatus or the process as recited in any one of Items 1 to 3, 42, 46, 49, and 52 to 56, wherein the spectrum of wavelengths of the scintillating light is in a range of approximately 250 nm to approximately 600 nm.

Item 62. The radiation detection apparatus or the process as recited in any one of the preceding Items, wherein a respective scintillation member comprises a metal halide, a metal oxide, or a metal silicate.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A radiation detection apparatus comprising:
    a first scintillation member that emits scintillating light having a spectrum of wavelengths;
    a first photosensor; and
    an optical coupling material disposed between the first photosensor and a side of the first scintillation member, wherein:
        the first photosensor is optically coupled to the side of the first scintillation member by the optical coupling material; and
        the optical coupling material is disposed adjacent to substantially all of the side of the first scintillation member, the optical coupling material being capable of absorbing a particular wavelength of radiation within approximately 75 nm of any wavelength within the spectrum of wavelengths emitted by the first scintillation member.

2. The radiation detection apparatus of claim 1, wherein the optical coupling material includes a dye having a color corresponding to a wavelength within the spectrum of wavelengths of the scintillating light.

3. The radiation detection apparatus of claim 2, further comprising a second scintillation member that emits scintillating light having a spectrum of wavelengths, the optical coupling material disposed adjacent to substantially all of a side of the second scintillation member, and the optical coupling material being capable of absorbing a particular wavelength of radiation within approximately 75 nm of any wavelength within the spectrum of wavelengths emitted by the second scintillation member.

4. The radiation detection apparatus as recited in claim 3, further comprising a second photosensor optically coupled to the second scintillation member by the optical coupling material, and wherein the optical coupling material is disposed between the second photosensor and the second scintillation member.

5. The radiation detection apparatus as recited in claim 1, wherein the photosensor comprises a photodiode, a PIN silicon diode, a photomultiplier tube, a silicon photomultiplier, an avalanche photodiode, a hybrid photomultiplier tube, or any combination thereof.

6. The radiation detection apparatus as recited in claim 1, wherein a percentage of photons exiting the first scintillation member into the optical coupling material that is sensed by at least one other photosensor is no greater than approximately 32%.

7. The radiation detection apparatus as recited in claim 1, wherein substantially no voids are disposed between the first scintillation member and the photosensor.

8. The radiation detection apparatus as recited in claim 1, wherein the optical coupling material includes a window and wherein the window is capable of absorbing the particular wavelength of radiation within approximately 75 nm of any wavelength within the spectrum of wavelengths.

9. The radiation detection apparatus as recited claim 3, wherein the first scintillation member and the second scintillation member lie along a substantially common plane.

10. The radiation detection apparatus as recited in claim 3, wherein a pitch corresponding to the first scintillation member, the second scintillation member, or both is within a range of approximately 0.3 mm to approximately 9 mm and a length within a range of approximately 0.8 mm to approximately 50 mm.

11. The radiation detection apparatus as recited in claim 1, wherein the radiation detection apparatus comprises a medical imaging apparatus, a well logging apparatus, or a security inspection apparatus.

12. The radiation detection apparatus as recited in claim 1, wherein the optical coupling material comprises an organic polymer.

13. The radiation detection apparatus as recited in claim 1, wherein the thickness of the optical coupling material is within a range of approximately 45 micrometers to approximately 2 millimeters.

14. The radiation detection apparatus of claim 1, wherein the first scintillation member emits scintillating light having a spectrum of wavelengths in a range of approximately 250 nm to approximately 600 nm.

15. A radiation detection apparatus comprising:
    a first scintillation member that emits scintillating light having a color $a_1^*$, $b_1^*$, expressed in terms of a*, representing the position of the color between red/magenta and green, and b*, representing the position of the color between yellow and blue; and an optical coupling material disposed adjacent to substantially all of a side of the first scintillation member, and the optical coupling material having a corresponding a* coordinate, a2*, and a corresponding b* coordinate, b2*, wherein: the difference between the corresponding a* coordinates of the scintillating light and of the optical coupling material $|a_1^* - a_2^*|$ is no greater than approximately 18;

the optical coupling material is capable of absorbing a particular wavelength of radiation within approximately 75 nm of any wavelength within a spectrum of wavelengths of scintillating light emitted by the first scintillation member; and a first photosensor coupled to the side of the first scintillation member by the optically coupling material.

16. The radiation detection apparatus of claim 15, wherein the difference between the corresponding b* coordinates of the scintillating light and of the optical coupling material $|b1^* b2^*|$ is no greater than approximately 12.

17. The radiation detection apparatus of claim 15, wherein the optical coupling material includes a dye including a corresponding a* coordinate and a corresponding b* coordinate, wherein the difference between the corresponding a* coordinates of the scintillating light and of the dye is no greater than approximately 18.

18. The radiation detection apparatus as recited in claim 15, wherein the color of the scintillation light has a lightness value L*, where L*=0 yields black and L*=100 indicates diffuse white, and wherein the dye has a corresponding L* value that is greater than 0.

19. A process comprising:
dispensing an optical coupling material onto a surface of a scintillation member, the optical coupling material being capable of absorbing a particular wavelength of radiation within approximately 75 nm of any wavelength within a spectrum of wavelengths of scintillating light emitted by the scintillation member; and
coupling the surface of the scintillation member and a surface of a photosensor to each other using the optical coupling material.

20. The process of claim 19, wherein the optical coupling material comprises a dye having a color corresponding to a wavelength within the spectrum of wavelengths of the scintillating light.

21. The process of claim 19, wherein the light emitted by the scintillation member has a color expressed in terms of a*, representing the position of the color between red/magenta and green, and b*, representing the position of the color between yellow and blue, and in which the optical coupling material includes a dye having corresponding a* and b* coordinates, wherein the difference between the corresponding a* coordinates of the scintillating light and of the dye is no greater than approximately 18.

22. The process of claim 21, wherein the difference between the corresponding b* coordinates of the scintillating light and of the dye is no greater than approximately 12.

23. The process of claim 19, wherein dispensing an optical coupling material onto a surface of a scintillation member comprises:
identifying a dye having a color that approximately corresponds to a particular wavelength within a spectrum of wavelengths of scintillating light of a particular scintillation member;
dyeing the optical coupling material with the dye; and
dispensing the optical coupling material onto a surface of a scintillation member.

24. The process as recited in claim 23, further comprising:
selecting a different dye having a different color that approximately corresponds to a wavelength within a different spectrum of scintillating light of an additional scintillation member; and
dyeing additional optical coupling material with the different dye.

25. The process as recited in claim 23, wherein dyeing the optical coupling material modifies a corresponding a* coordinate of the optical coupling material, a corresponding b* coordinate of the optical coupling material, or both.

\* \* \* \* \*